United States Patent [19]
Manning

[11] Patent Number: 5,646,898
[45] Date of Patent: Jul. 8, 1997

[54] TWO STAGE DRIVER CIRCUIT

[75] Inventor: Troy A. Manning, Boise, Id.

[73] Assignee: Micron Technology, Inc., Boise, Id.

[21] Appl. No.: 572,157

[22] Filed: Dec. 13, 1995

[51] Int. Cl.⁶ .................................................. G11C 7/00
[52] U.S. Cl. ..................... 365/205; 365/189.11; 365/226
[58] Field of Search ............................. 365/205, 189.11, 365/230.06, 190, 226, 207, 208

[56] References Cited

U.S. PATENT DOCUMENTS

| | | | |
|---|---|---|---|
| 4,397,003 | 8/1983 | Wilson et al. | 365/205 |
| 4,972,374 | 11/1990 | Wang et al. | 365/189.11 |
| 4,984,204 | 1/1991 | Sato et al. | 365/189.11 |
| 5,293,342 | 3/1994 | Casper et al. | 365/203 |
| 5,377,143 | 12/1994 | McClure | 365/189.11 |
| 5,467,313 | 11/1995 | Jung et al. | 365/189.11 |

*Primary Examiner*—Tan T. Nguyen
*Attorney, Agent, or Firm*—Seed and Berry LLP

[57] ABSTRACT

In an integrated semiconductor device, a driver circuit is provided for driving a circuit node to a pumped voltage higher than the supply voltage. The driver circuit includes a first driver circuit and a second driver circuit. During a standby mode, the first driver circuit drives the circuit node toward a supply voltage using a conventional voltage supply source. During an active mode, the first driver circuit is disconnected from the circuit node and the second driver circuit drives the circuit node to the pumped voltage using a charge pump. Since the first driver circuit initially drives the potential of the circuit node to the supply voltage without using the charge pump, the driver circuit according to the present invention requires substantially less current to operate than the prior art driver circuit.

37 Claims, 4 Drawing Sheets

TWO STAGE DRIVER CIRCUIT

TECHNICAL FIELD

This invention relates to integrated memory devices, and more particularly to a circuit for driving a circuit node to a pumped voltage.

BACKGROUND OF THE INVENTION

Integrated memory circuits use sense amplifiers to read a memory state from a selected memory cell. A detailed operation of the sense amplifier is described, for example, in U.S. Pat. No. 4,397,003 to Wilson et al. As shown in the Wilson patent, each sense amplifier receives a pair of bit lines. The bit lines are precharged to a given potential. Once precharged, the selected memory cell is connected to one of the bit lines. The sense amplifier senses the voltage differential on the two bit lines and generates outputs on the bit lines corresponding to the memory state of the selected memory cell.

Because sense amplifiers occupy relatively large layout space, each sense amplifier is typically shared between multiple bit line pairs. For example, the memory array in an integrated memory circuit is divided into two sections and the bit line pair from each section are connected to the same sense amplifier. To isolate one bit line pair from the sense amplifier when reading from the other pair, an isolation transistor is positioned between the sense amplifier and each bit line. Thus, to isolate one bit line pair the corresponding isolation transistors turn off to disconnect those bit lines from the sense amplifier. For the other bit line pair to be accessed, on the other hand, the corresponding isolation transistors turn on to connect those bit lines to the sense amplifier.

When the selected memory cell is being accessed, the voltage differential of the bit line pair is in the relatively low range of 100 millivolts to 200 millivolts. In order to sense such low voltage differentials, it is important to be able to pass the full voltage from the bit line pair to the sense amplifier without a significant voltage drop across the isolation transistors. However, voltage drops across the isolation transistors can be avoided only by driving the gates of the isolation transistors to a higher voltage than the supply voltage. The higher voltage should be greater than the sum of the supply voltage and the threshold voltage of the isolation transistors. For a supply voltage Vcc of 3 volts, the threshold voltage of the isolation transistor may be approximately 1.2 volts. Accordingly, the gate voltage of the isolation transistor should be driven to at least 4.2 volts. Typically, the required higher voltage is generated from a charge pump. The charge pump receives the supply voltage Vcc and pumps it up to a pumped voltage Vccp. A driver circuit receives the pumped voltage and drives the gates of the isolation transistors to the pumped voltage Vccp.

Figure 1:
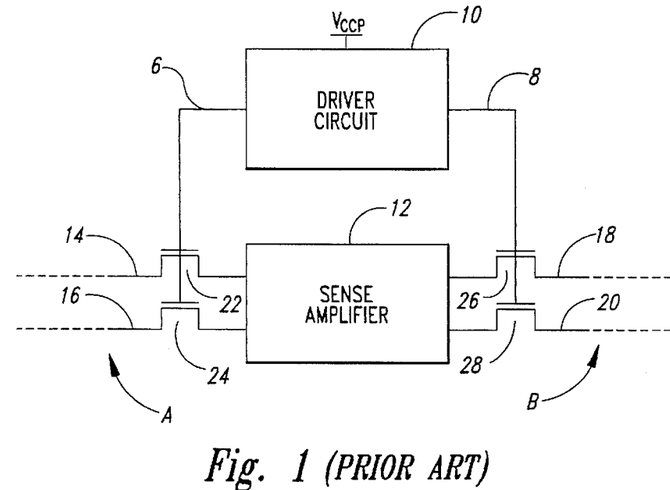
FIG. 1 is a block diagram of a prior art driver circuit connected to isolation transistors.

FIG. 1 shows a block diagram of a prior art driver circuit connected to the isolation transistors. A sense amplifier 12 is connected to a bit line pair 14-16 of memory array section A and a bit line pair 18-20 of memory array section B. Isolation transistors 22-24 are connected to the bit line pair 18-20 and isolation transistors 26-28 are connected to the bit line pair 18-20. The gates of the transistors 22-24 are connected to a first output 6 of the driver circuit 10. The gates of the transistors 26-28 are connected to a second output 8. The driver circuit receives a pumped voltage Vccp generated from a charge pump (not shown). In operation, a row decoder (not shown) selectively addresses one row in array section A or array section B. A column decoder (not shown) selectively addresses one bit line. Through the addressed row line and bit line, one memory access transistor is coupled to the corresponding sense amplifier. When memory array section A is being accessed, the driver circuit 10 couples the gates of the isolation transistors 22-24 to the pumped voltage. Simultaneously, the driver circuit 10 drives the gates of the isolation transistors 18-20 to ground in order to isolate the bit line pair 18-20 from the sense amplifier 12.

One disadvantage of the driver circuit 10 is that because charge pumps are generally inefficient, raising the gate voltage from ground to the pumped voltage requires a large amount of current.

Thus, it would be desirable to provide a more efficient driver circuit to drive the gate voltage to the pumped voltage.

SUMMARY OF THE INVENTION

According to the principles of the present invention, a driver circuit for driving a circuit node to a predetermined voltage is provided. Typically, the driver circuit is used in an integrated circuit device having a standby mode and an active mode. The driver circuit comprises a first driver circuit and a second driver circuit. When the integrated circuit device is in the standby mode, the first driver circuit drives the circuit node toward a supply voltage using a conventional voltage supply source. When the integrated memory device switches to the active mode, the first driver circuit is disconnected from the circuit node and the second driver circuit drives the circuit node to a higher voltage level than the supply voltage using a charge pump. Since the first driver circuit drives the potential of the circuit node to the supply voltage without using the charge pump, the driver circuit according to the present invention requires substantially less current to operate than the prior art driver circuit.

DETAILED DESCRIPTION OF THE INVENTION

Figure 2:
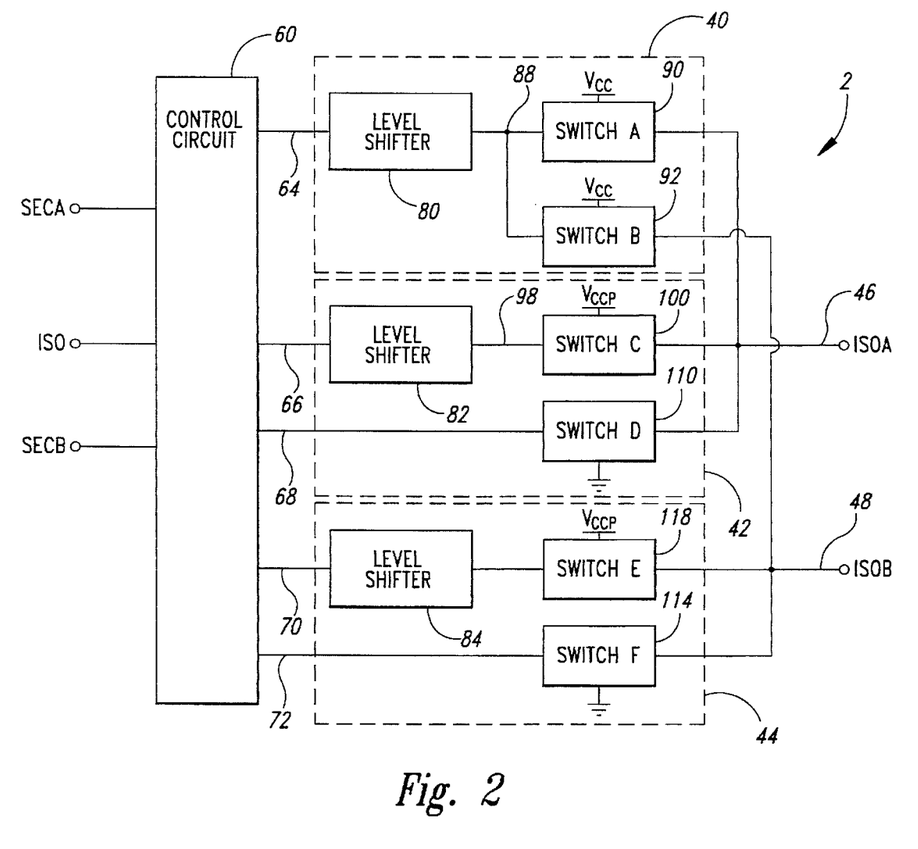
FIG. 2 is a block diagram of a driver circuit according to the present invention.
Figure 3:
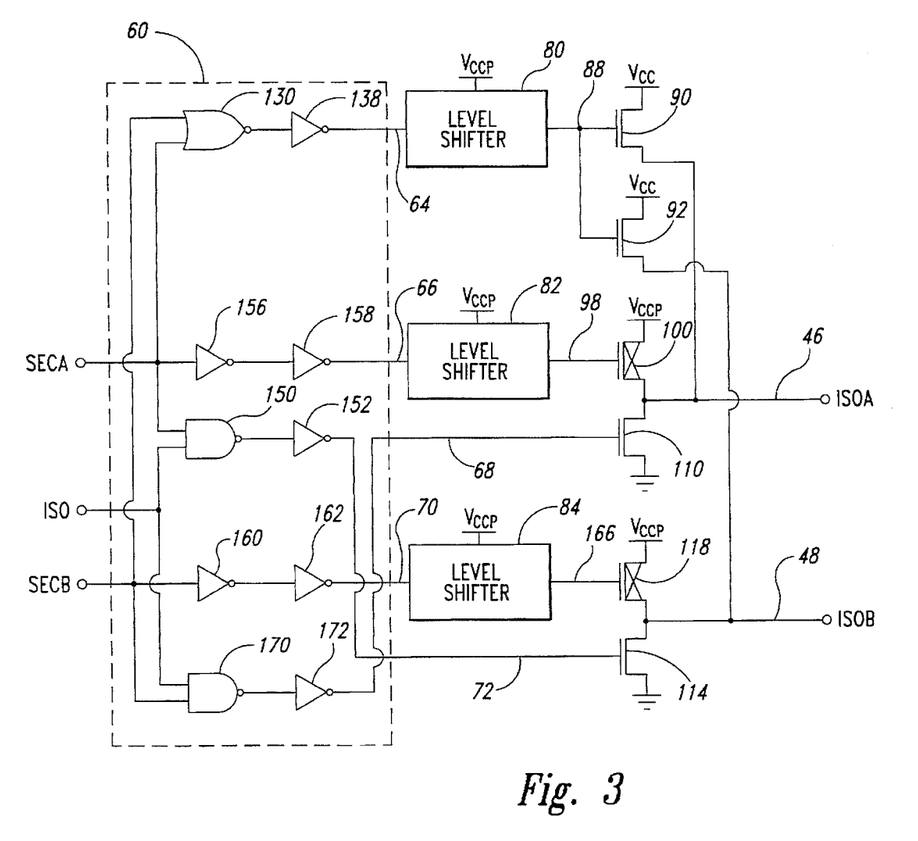
FIG. 3 is a schematic and logic diagram of the driver circuit of FIG. 2.

FIG. 2 is a block diagram of a driver circuit according to the present invention. The driver circuit 2 comprises a first driver circuit 40, a second driver circuit 42, and a third driver circuit 44. The first driver circuit 40 is connected to circuit nodes ISOA 46 and ISOB 48 for driving both circuit nodes to a supply voltage. The second driver circuit 42 is connected to the circuit node ISOA 46 to drive that node to a pumped voltage after the first driver circuit 40 drives the node 46 to the supply voltage. The third driver circuit 48 is connected to the circuit node ISOB 48 for driving that node to the pumped voltage after the first driver circuit 40 drives the node 48 to the supply voltage. Thus, the driver circuit 2 uses a conventional voltage supply circuit to drive a circuit node to the supply voltage. The driver circuit 2 then uses a charge pump to further drive the circuit node to the pumped voltage Vccp. Typically, the charge pump is only about 30% efficient relative to the convention voltage supply and raising the circuit node directly from ground all the way up to the pumped voltage Vccp using only the change pump requires a large amount of current. Since the conventional voltage supply circuit in the first driver circuit 40 drives the potential of the circuit nodes 46, 48 to the supply voltage Vcc without using the charge pump, the driver circuit 2 requires substantially less current to operate than the prior art driver circuit of FIG. 1.

A detailed operation of the driver circuit 2 will now be described. In a standby state of a memory chip, the input signals SECA, ISO, and SECB are all at logic low. A control circuit 60 receives the input signals SECA, ISO, and SECB, and generates various output signals 64-72 to control the first, second and third driver circuits 40-44. When a memory cycle is initiated and memory section A is selected, the input signal SECA goes to logic high while the input signals SECB and ISO stay at logic low. Shortly thereafter, the input signal ISO goes to logic high signifying that memory section B is to be isolated from the sense amplifier 12. Once the memory section B is isolated, a selected memory cell from memory section A is accessed. When the memory cycle is completed, the signal ISO switches to logic low, thereby signifying that memory section B no longer needs to be isolated. Shortly thereafter, the signal SECA switches to logic low. Similarly, when memory section B is selected, the input signal SECB goes to logic high while the input signals SECA and ISO stay at logic low. Shortly thereafter, the input signal ISO goes to logic high, signifying that memory section A is to be isolated from the sense amplifier 12. Once the memory section A is isolated, a selected memory cell from memory section B is accessed. When the memory cycle is completed, the signal ISO switches to logic low, thereby signifying that memory section A no longer needs to be isolated. Shortly thereafter, the signal SECA switches to logic low.

During the standby state, the control circuit 60 receives logic low signals from all of the input signals SECA, ISO, and SECB. In response, the control circuit 60 generates a logic low at its outputs 64-72. A level shifter 80, which is identical to level shifters 82 and 84, receives the logic low signal and generates a logic high at its output 88. In response, switch A 90 and switch B 92 close to connect a supply voltage node Vcc to the circuit nodes 46 and 48. Thus, the first driver circuit 40 drives both circuit nodes 46, 48 to the supply voltage during the standby state of the memory chip. At the same time, the level shifter 82 receives a logic low signal from the output 66 of the control circuit 60, and generates a logic high at its output 98. In response, a switch C 100 opens to isolate a pumped voltage node Vccp from the circuit node ISOA 46. During the standby state, a switch D 110 also receives the logic low signal from the output 68 of the control circuit 60. In response, the switch D 110 opens to disconnect the circuit node 46 from ground. Since both switch C 100 and switch D 110 are open, the second driver circuit 42 is disconnected from the circuit node 46 during the standby state.

The third driver circuit 44 connected to the circuit node 48 is identical to the second driver circuit 42 and operates in a similar manner. Accordingly, the third driver circuit 44 is also disconnected from the circuit node 48 during the standby state. Thus, during the standby state, only the first driver circuit 40 is connected to the circuit nodes 46 and 48 to initially drive both circuit nodes to the supply voltage using a conventional supply voltage source Vcc, and thereafter maintain the nodes 46, 48 at the supply voltage.

Assume now that a memory cycle is initiated and memory section A is selected by the memory chip. The input signal SECA switches to logic high. This causes the output signals 64 and 66 to switch to logic high. The logic high signal at the input 64 causes the level shifter 80 to switch its output 88 to logic low. In response, the switches A and B 90, 92 open and disconnect the supply voltage node Vcc from the circuit nodes 46 and 48. At approximately the same time, the logic high at the output 66 causes the level shifter 82 to switch its output 98 to logic low. In response, the switch C 100 closes and connects the pumped voltage node Vccp to the circuit node 46 to drive that node to the pumped voltage from the charge pump voltage supply (not shown).

Shortly after the input signal SECA goes high, the input signal ISO also switches to logic high. This causes the output 72 to switch to logic high. In response, a switch F 114 closes and connects the circuit node 48 to ground. With reference also to FIG. 1, the Vccp voltage on the ISOA node 46 closes the transistors 22, 24 thereby connecting the bit line pair 14-16 to the sense amplifier 12. At the same time, the ground potential on the ISOB node 48 opens the transistors 26, 28 thereby isolating the bit line pair 18-20 from the sense amplifier 12.

When the memory cycle terminates, the input signal ISO switches to logic low, thereby causing the output 72 to switch to logic low. In response, the switch F 114 opens to disconnect the circuit node 48 from ground. While the circuit node 48 is floating, the voltage level at the node remains at zero volts because the stored charge on the circuit node 48 had previously been discharged through the switch F 114. Shortly after the input signal ISO switches to logic low, the input signal SECA also switches to logic low. In response, the control circuit 60 switches the outputs 64-66 to logic low. The level shifter 82 receiving the logic low at the output 66 switches its output 98 to logic high. In response, the switch C 100 opens and disconnects the circuit node 46 from the pumped voltage node Vccp. At approximately the same time, the logic low signal at the output 64 causes the level shifter 80 to switch its output 88 to logic high. In response, the switches A and B 90, 92 close to connect the supply voltage node Vcc to the circuit nodes 46 and 48, respectively. In a similar manner, the ISOA node 46 can be driven to ground through the switch D 110 and the ISOB node 48 can be driven to Vccp through a switch E 118. In this condition, the driver circuit 2 opens the transistors 22-24 to isolate the bit lines 14, 16 from the sense amplifier 12 and closes the transistors 22-24 to connect the bit lines 18, 20 to the sense amplifier 12.

Figure 4A:
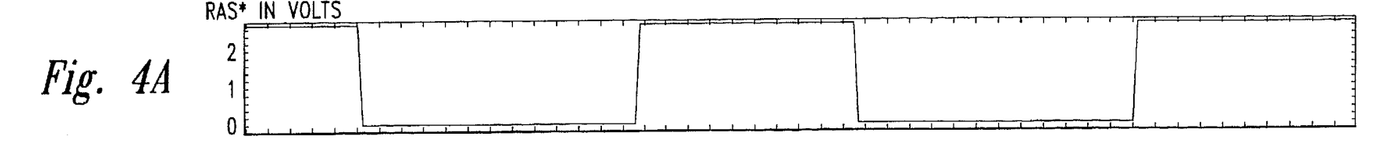
FIGS. 4A–4F are a set of timing diagrams of input and output signals of the driver circuit of FIG. 3.
Figure 4B:
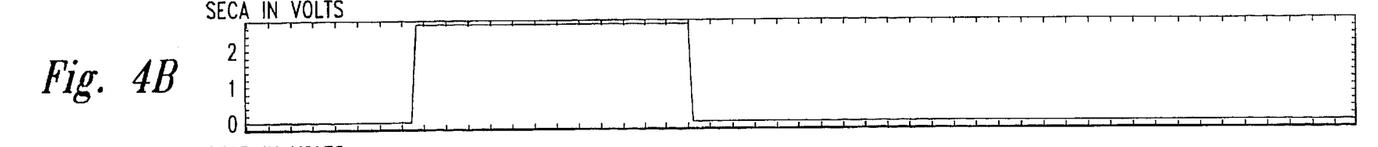
Figure 4C:
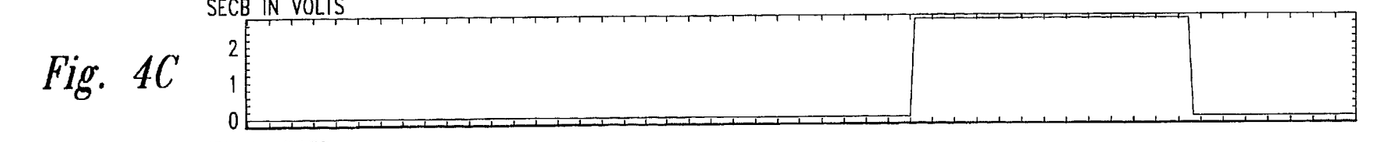
Figure 4D:
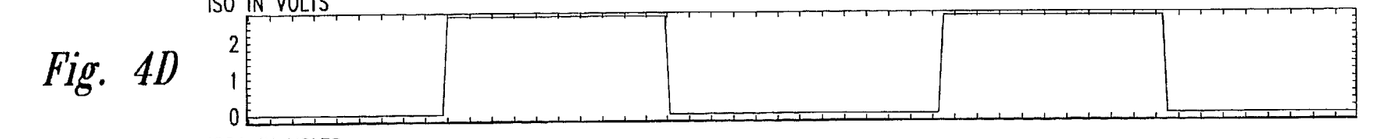
Figure 4E:
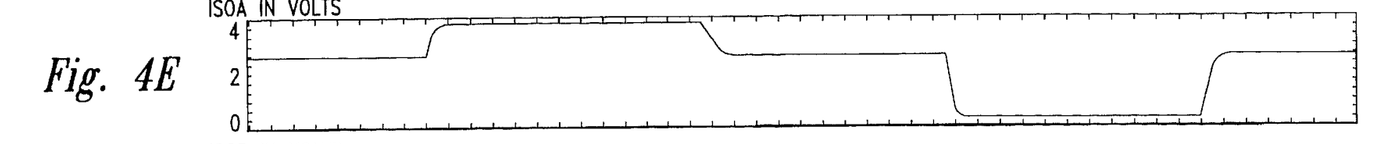
Figure 4F:
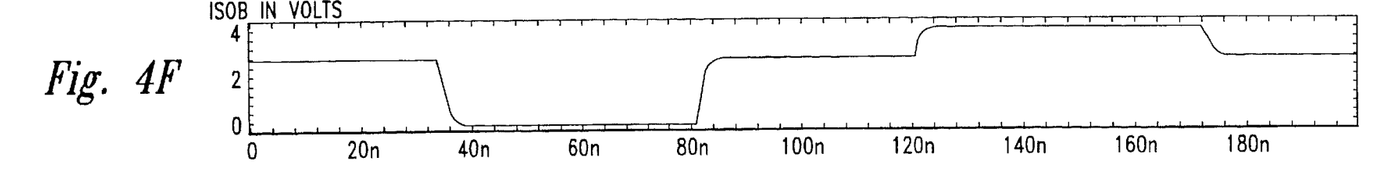

A detailed operation of the driver circuit 2 during a memory cycle will now be explained with reference to FIGS. 3 and 4A-4F for two examples. In the first example, memory section A is selected. The RAS* signal switches to logic low to initiate the memory cycle (t=20 ns). Initially, the input SECA switches to logic high (t=30 ns). The logic high signal causes a NOR gate 130 to switch to logic low and an inverter 138 to switch to logic high. The logic high at the output 64 causes the level shifter 80 to switch its output 88 to logic low. In response, the transistors 90, 92 turn off and isolate the circuit nodes 46, 48 from the supply voltage node Vcc. At approximately the same time, the logic high signal at the input SECA is reproduced at the output 66 through two series connected inverters 156, 158. The logic high at the output 66 causes the level shifter 82 to switch its output 98 to logic low. In response, the PMOS transistor 100 turns on to couple the pumped voltage node Vccp to the circuit node 46. As can be seen in FIG. 4E, the circuit node 46 is driven from the supply voltage to the pumped voltage within a few nanoseconds (t=32 to 35 ns). Shortly thereafter, the input signal ISO also switches to logic high (t=35 ns) to signify that the non-selected memory section should be isolated from the sense amplifier. The logic high signals of SECA and ISO causes a NAND gate 150 to switch to logic low and an inverter 152 to switch to logic high. In response, the NMOS transistor 114 turns on to drive the circuit node 48 to ground (t=36 ns). At this stage, the bit lines 18, 20 (FIG. 1) from the memory section B are isolated from the sense amplifier 12 while the bit lines 14, 16 from the memory section A are connected to the sense amplifier 12 to allow the sense amplifier 12 to access a selected memory cell from memory section A.

Once the selected memory cell is accessed, RAS* switches to the logic high state to terminate the memory cycle (t=70 ns). When the memory cycle terminates, the input signal ISO switches to logic low (t=76 ns) signifying that memory section B no longer needs to be isolated. When the input ISO switches to the logic low state, the NAND gate 150 switches to logic high and the inverter 152 switches to logic low. In response, the transistor 114 turns off and isolates the circuit node 48 from ground. Shortly thereafter, the input SECA switches to logic low (t=80 ns). In response, the control circuit 60 switches the output 66 to logic low through two inverter delays 156, 158. The logic low at the output 66 causes the level shifter 82 to switch its output 98 to the pumped voltage. In response; the transistor 100 turns off to isolate the circuit node 46 from the pumped voltage Vccp. At approximately the same time, the logic low of the input signals SECA and SECB causes the NOR gate 130 to switch its output to logic high and the inverter 138 to switch to logic low. In response to the logic low state at the output 64, the level shifter 80 switches its output from ground to the pumped voltage Vccp. The pumped voltage at the output 88 fully turns on the NMOS transistors 90, 92 to couple the circuit nodes 46, 48 to the supply voltage Vcc. The supply voltage is maintained on the nodes 46, 48 until a new memory cycle is initiated.

In the second example, memory selection B is selected. As in the first example, the input signals SECA, SECB, and ISO are all at logic low during the standby state, and the transistors 90, 92 couple the supply voltage node Vcc to the circuit nodes 46, 48 to maintain the nodes at the supply voltage. The RAS* signal switches to logic low to initiate a new memory cycle (t=110 ns). Initially, the input SECB switches to logic high (t=120 ns). As in the first example, the logic high signal causes the NOR gate 130 to switch to logic low and the inverter 138 to switch to logic high. The logic high at the output 64 causes the level shifter 80 to switch its output 88 to logic low. In response, the transistors 90, 92 turn off and isolate the circuit nodes 46, 48 from the supply voltage node Vcc. At approximately the same time, the logic high signal at the input SECB is reproduced at the output 70 through two series connected inverters 160, 162. The logic high at the output 70 causes the level shifter 84 to switch its output 166 to logic low. In response, the PMOS transistor 118 turns on to couple the pumped voltage node Vccp to the circuit node 48. The circuit node 48 is then driven from the supply voltage to the pumped voltage within a few nanoseconds (t=122 to 125 ns). Shortly thereafter, the input signal ISO also switches to logic high (t=125 ns) to signify that the non-selected memory section should be isolated from the sense amplifier. The logic high signals of SECB and ISO causes a NAND gate 170 to switch to logic low and an inverter 172 to switch to logic high. In response, the NMOS transistor 110 rams on to drive the circuit node 46 to ground. At this stage, the bit lines 14, 16 (FIG. 1) from memory section A are isolated from the sense amplifier 12 while the bit lines 18, 20 from memory section B are connected to the sense amplifier 12 to allow the sense amplifier to access a selected memory cell from memory section B.

Once the selected memory cell is accessed, RAS* switches to the logic high state to terminate the memory cycle (t=160 ns). When the memory cycle terminates, the input signal ISO switches to logic low (t=164) signifying that memory section A no longer needs to be isolated. When the input ISO switches to the logic low state, the NAND gate 170 switches to logic high and the inverter 172 switches to logic low. In response, the transistor 110 turns off and isolates the circuit node 46 from ground. Shortly thereafter, the input SECB switches to logic low (t=170 ns). In response, the output 70 switches to logic low through the two inverter delays 160, 162. The logic low at the output 70 causes the level shifter 84 to switch its output 166 to the pumped voltage Vccp. In response, the PMOS transistor 118 turns off to isolate the circuit node 48 from the pumped voltage node Vccp. At approximately the same time, the logic lows of the input signals SECA and SECB cause the NOR gate 130 to switch its output to logic high and the inverter 138 to switch to logic low. In response to the logic low state at the output 64, the level shifter 80 switches its output from ground to the pumped voltage Vccp. The pumped voltage at the output 88 once again turns on the transistors 90, 92 to couple the circuit nodes 46, 48 to the supply voltage node Vcc. The supply voltage is maintained on the nodes 46, 48 until another memory cycle is initiated.

Figure 5:
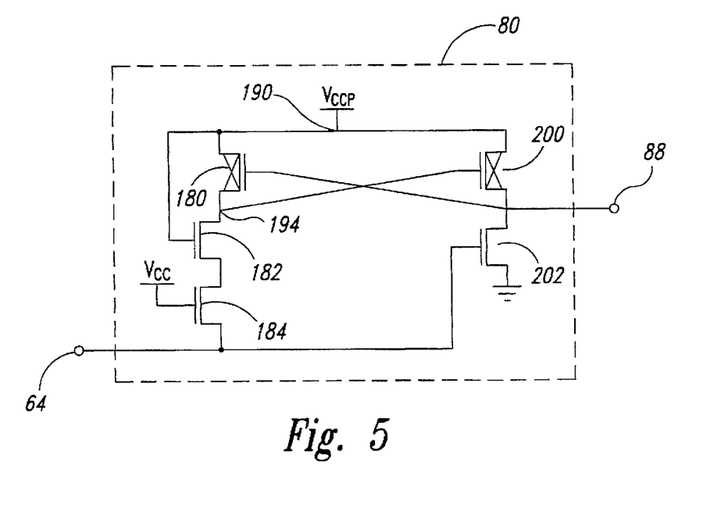
FIG. 5 is a schematic of a level shifter in the driver circuit of FIG. 2.

A detailed operation of the level shifters 80-84 in the driver circuit of FIG. 2 will now be described with reference to FIG. 5. A PMOS transistor 180 and two NMOS transistors 182, 184 are connected in series between a pumped voltage node 190 and an input 64. The gate of the transistor 182 is connected to node 190 while the gate of the transistor 184 is connected to the supply voltage node Vcc. In operation, the transistors 182, 184 receiving the pumped voltage Vccp and the supply voltage Vcc, respectively, act as pass transistors and couple the input 64 to a node 194. A PMOS transistor 200 and an NMOS transistor 202 are connected in series between the pumped voltage node 190 and ground. The gate of the transistor 202 receives the input 64. The gates of the transistors 188, 200 are cross-coupled to each other with the gate of the transistor 180 connected to the drain of the transistor 200 and the gate of the transistor 200 connected to the drain of the transistor 180.

In operation, when the input 64 receives a logic low signal, for example zero volts, the transistors 182, 184 pull the node 194 to ground. The zero volts at the input 64 turns off the transistor 202 to isolate the output 88 from ground. The logic low at node 194 turns on the transistor 200 to couple the pumped voltage node 190 to the output 88. The pumped voltage at the output 88 then turns off the transistor 180 to isolate the Vccp node 190 from the node 194. Thus, the level shifter 80 shifts the input voltage of zero volts to an output voltage equal to the pumped voltage Vccp. On the other hand, when the input 64 receives a logic high, for example the supply voltage of Vet, the transistors 182, 184 are turned off. The logic high at the input 64 also turns on the transistor 202 to drive the output 88 to ground. The zero volts at the output 88 turns on the transistor 180 to couple node 194 to the pumped voltage Vccp. The Vccp voltage on the node 194 then turns off the transistor 200. Thus, the level shifter 80 shifts a logic high input signal to an output signal of zero volts or logic low.

Figure 6:
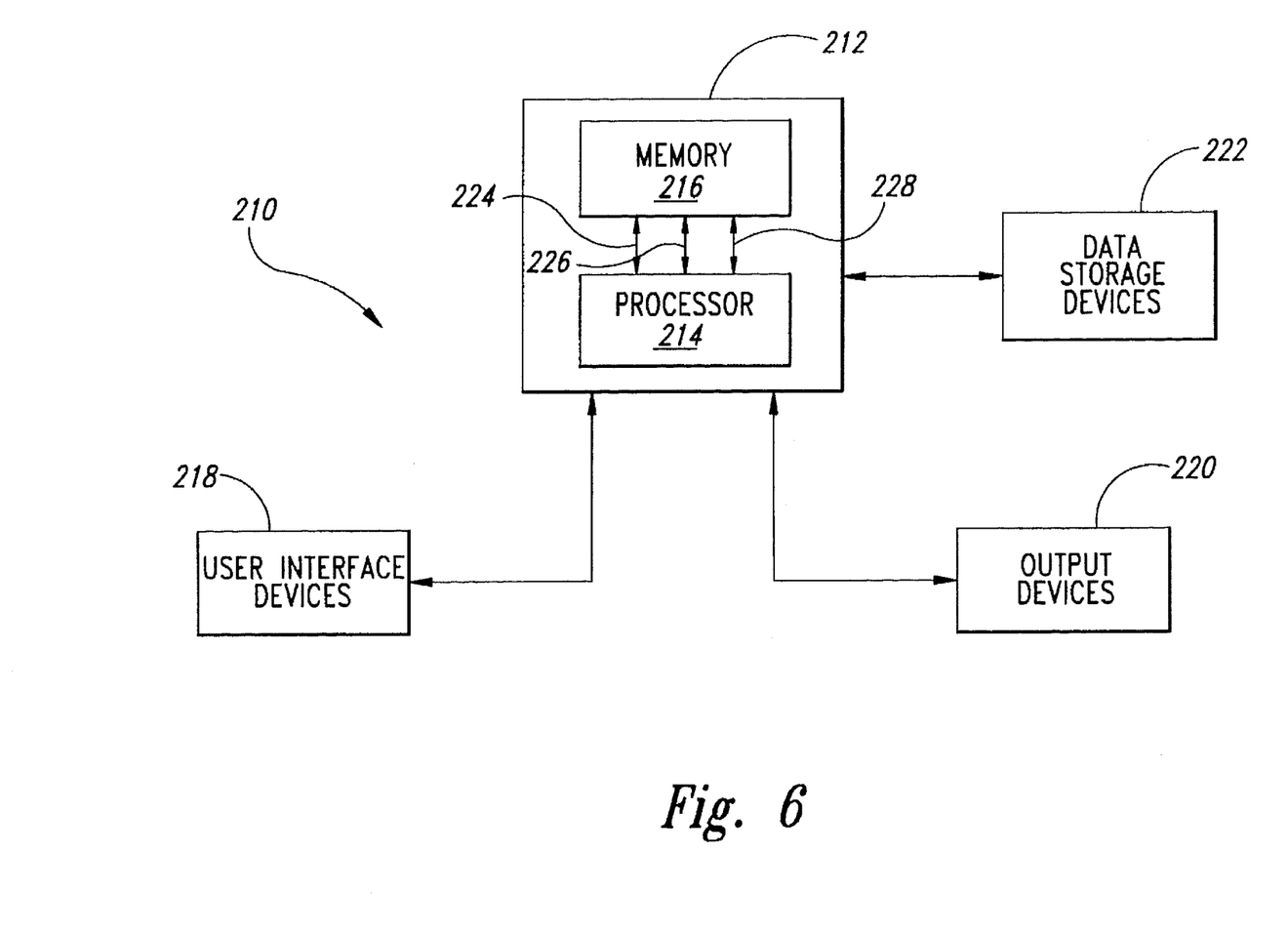
FIG. 6 is a block diagram of a computer system with memory that uses the driver circuit of FIG. 2.

FIG. 6 is a computer system with memory that uses the driver circuit 2 of FIG. 2. The computer system 210 includes computer circuitry 212 for performing computer functions, such as executing software to perform desired calculations and tasks. The circuitry 212 typically includes a processor 214 and a memory 216. One or more user interface devices 218, such as a keyboard or a mouse, are coupled to the computer circuitry 212 and allow a user to enter data into the computer circuitry 212. One or more output devices 220 are coupled to the computer circuitry 212 to display data generated by the computer circuitry 212. Examples of output devices 220 include a printer and a video display screen. One or more data storage devices 222 are coupled to the computer circuitry 212 to store or retrieve data from a storage media (not shown). Finally, the processor 214 communicates with the memory 216 through an address bus 224, a data bus 226, and a control and status bus 228.

The foregoing specific embodiments represent just some of the ways of practicing the present invention. Many other embodiments are possible within the spirit of the invention. Accordingly, the scope of the invention is not limited to the foregoing specification, but instead is given by the appended claims along with their full range of equivalents.

I claim:

1. A driver circuit for first and second transistors used for selectively isolating and connecting first and second bit lines from a sense amplifier in a dynamic random access memory powered by a power supply voltage, the driver circuit comprising:

a first switch circuit having an input receiving a first voltage in excess of the power supply voltage, the first switch circuit applying the first voltage to the gate of the first transistor responsive to a first control signal and to the gate of the second transistor responsive to a second control signal;

a second switch circuit having an input receiving a second voltage that is less than the power supply voltage, the second switch circuit applying the second voltage to the gate of the first transistor responsive to a third control signal and to the gate of the second transistor responsive to a fourth control signal; and a third switch circuit having an input receiving the power supply voltage, the third switch circuit applying the power supply voltage to the gate of the first transistor during at least part of the time that neither the first control signal nor the third control signal is being applied to the first and second switch circuits, respectively, the third switch circuit applying the power supply voltage to the gate of the second transistor during at least part of the time that neither the second control signal nor the fourth control signal is being applied to the first and second switch circuits, respectively.

2. The driver circuit of claim 1 wherein the first switch circuit includes respective switches applying the first voltage to the gates of the first and second transistors responsive to the first and second control signals, respectively.

3. The driver circuit of claim 1 wherein the second switch circuit includes respective switches applying the second voltage to the gates of the first and second transistors responsive to the third and fourth control signals, respectively.

4. The driver circuit of claim 1 wherein the third switch circuit includes respective switches applying the power supply voltage to the gates of the first and second transistors during at least part of the time that neither the first control signal nor the second control signal is being applied to the first switch circuit and neither the third control signal nor the fourth control signal is being applied to the second switch circuit.

5. The driver circuit of claim 1, further comprising a charge pump connected to the first switch circuit and generating a charge pump voltage that is in excess of the power supply voltage, and wherein the first voltage is the charge pump voltage.

6. The driver circuit of claim 1 wherein the second voltage is 0 volts.

7. A dynamic random access memory powered by a power supply voltage, the dynamic random access memory, comprising:

an array of memory cells arranged in rows and columns, the columns having at least one respective bit line:

a row decoder selectively addressing rows of the array responsive to a row address signal;

a column decoder selectively addressing columns of a array responsive to a column address signal;

a sense amplifier for sensing the voltage of the bit lines, the sense amplifier being selectively isolated and connected to the bit lines of the array by respective transistors; and a driver circuit for the transistors used for selectively isolating and connecting the bit lines from the sense amplifier, the driver circuit comprising:

a first switch circuit having an input receiving a first voltage in excess of the power supply voltage, the first switch circuit applying the first voltage to the gate of the transistors responsive to respective connect signals;

a second switch circuit having an input receiving a second voltage that is less than the power supply voltage, the second switch circuit applying the second voltage to the gates of the transistors responsive to respective isolate signals; and a third switch circuit having an input receiving the power supply voltage, the third switch circuit applying the power supply voltage to the gates of the transistors during at least part of the time that neither a connect signal is being applied to the first switch circuit nor an isolate signal is being applied to the second switch circuit for the respective transistor.

8. The dynamic random access memory of claim 7 wherein the first switch circuit includes respective switches applying the first voltage to the gates of the transistors responsive to the respective connect signals.

9. The dynamic random access memory of claim 7 wherein the second switch circuit includes respective switches applying the second voltage to the gates of the transistors responsive to respective isolate signals.

10. The dynamic random access memory of claim 7 wherein the third switch circuit includes respective switches applying the power supply voltage to the gates of the transistors during at least part of the time that neither a connect signal is being applied to the first switch circuit nor an isolate signal is being applied to the second switch circuit for the respective transistor.

11. The dynamic random access memory of claim 7, further comprising a charge pump generating a charge pump voltage that is in excess of the power supply voltage, and wherein the first voltage is the charge pump voltage.

12. The dynamic random access memory of claim 7 wherein the second voltage is 0 volts.

13. A driver circuit responsive to first, second and third control signals for selectively driving a switching transistor from a reference voltage toward a boosted voltage higher than a supply voltage so that the switching transistor selectively isolates and connects a sense amplifier to a bit line without a threshold voltage drop thereacross, the driver circuit comprising:
- a first switch receiving the reference voltage, the first switch being responsive to the first control signal to connect the reference voltage to the switching transistor to isolate the bit line from the sense amplifier;
- a second switch receiving the supply voltage and connecting the supply voltage to the switching transistor in response to the second control signal to drive the switching transistor toward the supply voltage; and
- a third switch receiving the boosted voltage and connecting the boosted voltage to the switching transistor in response to the third control signal to drive the switching transistor toward the boosted voltage after the second switch drives the switching transistor toward the supply voltage.

14. The driver circuit according to claim 13, further comprising:
- a first level shifter connected to an input of the second switch, the first level shifter being responsive to a fourth control signal to generate at its output the boosted voltage wherein the second switch connects the supply voltage to the switching transistor.

15. The driver circuit according to claim 14, further comprising:
- a second level shifter connected to an input of the third switch, the second level shifter being responsive to a fifth control signal to generate at its output the reference voltage wherein the third switch connects the boosted voltage to the switching transistor.

16. The driver circuit according to claim 15, further comprising a control circuit for generating the first, second, third, fourth and fifth control signals.

17. The driver circuit according to claim 13 wherein the first and second switches are NMOS transistors and the third switch is a PMOS transistor.

18. In an integrated circuit device having an inactive mode and an active mode, a driver circuit for selectively driving the gate of a first transistor so that the first transistor selectively isolates and connects a sense amplifier to a first bit line, the driver circuit also for selectively driving the gate of a second transistor so that the second transistor selectively isolates and connects the sense amplifier to a second bit line, the driver circuit comprising:
- a first driver circuit receiving a supply voltage and having an output connected to the first and second transistors, wherein during the inactive mode the first driver circuit drives the gates of the first and second transistors toward the supply voltage;
- a second driver circuit receiving a boosted voltage higher than the supply voltage and having an output connected to the first transistor, wherein during the active mode the second driver circuit drives the gate of the first transistor toward the boosted voltage in response to a first control signal; and
- a third driver circuit receiving the boosted voltage and having an output connected to the second transistor, wherein during the active mode the third driver circuit drives the gate of the second transistor toward the boosted voltage in response to a second control signal.

19. The driver circuit according to claim 18 wherein the first driver circuit includes:
- a level shifter circuit receiving the boosted voltage; and
- a switch receiving the supply voltage and having an input connected to the level shifter circuit, the switch for connecting the supply voltage to the first transistor.

20. The driver circuit according to claim 19 wherein the switch is a transistor having a gate connected to the level shifter circuit.

21. The driver circuit according to claim 19 wherein the first driver circuit further includes a second switch receiving the supply voltage and having an input connected to the level shifter circuit, the second switch for connecting the supply voltage to the second transistor.

22. The driver circuit according to claim 18 wherein the second driver circuit includes:
- a level shifter circuit receiving the boosted voltage; and
- a switch receiving the boosted voltage and having an input connected to the level shifter circuit, the switch for connecting the boosted voltage to the first transistor.

23. The driver circuit according to claim 18, further comprising a control circuit for generating the first and second control signals.

24. The driver circuit according to claim 18, further comprising means for deactivating the first driver circuit and activating one of the second and third driver circuits during the active mode.

25. The driver circuit according to claim 18 wherein the second driver circuit includes a first switch for connecting the first transistor to a reference ground, and the third driver circuit includes a second switch for connecting the second transistor to the reference ground.

26. The driver circuit according to claim 18, further comprising a charge pump node for providing the boosted voltage to the second and third driver circuits.

27. A method of driving first and second transistors used for selectively isolating and connecting first and second bit lines from a sense amplifier in a dynamic random access memory powered by a power supply voltage, the method comprising:
- applying a first voltage in excess of the power supply voltage to the gate of the first transistor when the sense amplifier is to sense the state of the first bit line;
- applying a second voltage in excess of the power supply voltage to the gate of the second transistor when the sense amplifier is to sense the state of the second bit line;
- applying a third voltage to the gate of the first transistor when the sense amplifier is to be isolated from the first bit line; the second voltage being sufficiently smaller than the power supply voltage to turn off the first transistor when the second voltage is applied to its gate;
- applying a fourth voltage to the gate of the second transistor when the sense amplifier is to be isolated from the second bit line, the fourth voltage being sufficiently smaller than the power supply voltage to turn off the second transistor when the second voltage is applied to its gate;
- applying the power supply voltage to the gate of the first transistor prior to applying the first voltage to the gate of the first transistor; and
- applying the power supply voltage to the gate of the second transistor prior to applying the second voltage to the gate of the second transistor.

28. The method of claim 27 wherein the dynamic random access memory includes a charge pump generating a charge pump voltage, and wherein the first and second voltages are the charge pump voltage.

29. The method of claim 27 wherein the third and fourth voltages are 0 volts.

30. The method of claim 27 wherein the power supply voltage is applied to the gate of the first transistor during substantially the entire time that neither the first voltage nor the third voltage is being applied to the gate of the first transistor, and the power supply voltage is applied to the gate of the second transistor during substantially the entire time that neither the second voltage nor the fourth voltage is being applied to the gate of the second transistor.

31. A method of driving first and second transistors used for selectively isolating and connecting first and second bit lines from a sense amplifier in a dynamic random access memory powered by a power supply voltage, the method comprising:

applying the power supply voltage followed by a voltage in excess of the power supply voltage to the gate of the first transistor when the sense amplifier is to sense the state of the first bit line;

applying the power supply voltage followed by a voltage in excess of the power supply voltage to the gate of the second transistor when the sense amplifier is to sense the state of the second bit line;

applying a voltage to the gate of the first transistor that is sufficiently small to turn off the first transistor when the sense amplifier is to be isolated from the first bit line; and applying a voltage to the gate of the second transistor that is sufficiently small to turn off the second transistor when the sense amplifier is to be isolated from the second bit line.

32. The method of claim 31 wherein the dynamic random access memory includes a charge pump generating a charge pump voltage, and wherein the voltages in excess of the power supply voltage is the charge pump voltage.

33. The method of claim 31 wherein the voltages that are sufficiently small to turn off the first and second transistors is 0 volts.

34. In an integrated circuit device having an inactive mode and an active mode, a method of driving a circuit node connected to a gate of a transistor toward a boosted voltage higher than a supply voltage so that the transistor selectively isolates and connects a sense amplifier to a bit line, the method comprising the steps of:

during the inactive mode,
connecting the supply voltage to the circuit node to drive the circuit node substantially to the supply voltage; and
maintaining the circuit node substantially at the supply voltage; and during the active mode,
disconnecting the circuit node from the supply voltage; and
connecting the circuit node to the boosted voltage to drive the circuit node substantially to the boosted voltage.

35. The method according to claim 34, after the step of connecting the circuit node to the boosted voltage, further comprising the steps of:

disconnecting the circuit node from the boosted voltage; and connecting the circuit node to a reference ground to isolate the bit line from the sense amplifier.

36. In an integrated circuit device having an inactive mode and an active mode, a method of selectively driving a first node connected to a first transistor so that the first transistor selectively isolates and connects a sense amplifier to a first bit line, the driver circuit also for selectively driving a second node connected to a second transistor so that the second transistor selectively isolates and connects the sense amplifier to a second bit line, the method comprising the steps of:

connecting a supply voltage to the first and second nodes;
driving the first and second nodes substantially to the supply voltage; and In response to selection of one of the two nodes,
disconnecting the supply voltage from the selected node;
connecting the selected node to a boosted voltage higher than the supply voltage; and
driving the selected node substantially to the boosted voltage.

37. The method according to claim 36, further comprising the steps of:

disconnecting the supply voltage from the node other than the selected node; and connecting the node other than the selected node to a reference ground to isolate the bit line associated with the node other than the selected node from the sense amplifier.

* * * * *

UNITED STATES PATENT AND TRADEMARK OFFICE
CERTIFICATE OF CORRECTION

PATENT NO. : 5,646,898
DATED : July 8, 1997
INVENTOR(S) : Troy A. Manning

Page 1 of 1

It is certified that error appears in the above-identified patent and that said Letters Patent is hereby corrected as shown below:

Application Number [21]     "572,157"     -- 08/572,157 --

<u>Column 8,</u>
Line 15, "columns of a array" -- columns of the array --

Signed and Sealed this

Twenty-eighth Day of August, 2001

*Attest:*

*Attesting Officer*

NICHOLAS P. GODICI
*Acting Director of the United States Patent and Trademark Office*